United States Patent [19]

Kim

[11] Patent Number: 5,892,721

[45] Date of Patent: Apr. 6, 1999

[54] PARALLEL TEST CIRCUIT FOR MEMORY DEVICE

[75] Inventor: Dong Gyeun Kim, Cheongju, Rep. of Korea

[73] Assignee: LG Semicon Co., Ltd., Choongcheongbuk-Do, Rep. of Korea

[21] Appl. No.: 115,757

[22] Filed: Jul. 15, 1998

[30] Foreign Application Priority Data

Feb. 5, 1998 [KR] Rep. of Korea ............... 1998/3240

[51] Int. Cl.$^6$ .............................. G11C 7/00; G11C 16/04
[52] U.S. Cl. .............. 365/201; 365/189.05; 365/189.08
[58] Field of Search .............................. 365/201, 189.05, 365/189.08

[56] References Cited

U.S. PATENT DOCUMENTS 5,293,386  3/1994  Muhenthaler et al. ............ 365/201
5,301,142  4/1994  Suzuki et al. .................... 365/201
5,359,561  10/1994  Sakomura et al. ................ 365/201

*Primary Examiner*—David Nelms
*Assistant Examiner*—Trong Phan

[57] ABSTRACT

An parallel test circuit for memory device is provided. The parallel test circuit according to the present invention includes: a plurality of memory mats, wherein each of memory mats comprises a memory cell for writing two-bit data and an X, Y address decoder for accessing the memory cell; a amplifying unit having a plurality of main amplifiers, wherein each of main amplifiers compares and amplifies a voltage difference between two-bit data of corresponding memory cell, and thereby output one-bit logic value; a data reducing unit for reducing a plurality of logic value from the amplifying unit to one-bit logic value. Accordingly, the parallel test circuit according to the present invention improves test efficiency twice by which a single main amplifier compares and amplifies two-bit data.

14 Claims, 3 Drawing Sheets

PARALLEL TEST CIRCUIT FOR MEMORY DEVICE

BACKGROUND OF THE INVENTION

1. Field of the Invention

The present invention relates to a parallel test mode for memory device, and more particularly to a parallel test circuit for memory device capable of improving test efficiency by which a single main amplifier compares and amplifies two-bit data.

2. Discussion of the Background

FIG. 1 is a simplified schematic diagram of a four-bit parallel test circuit for DRAM according to a conventional art.

As shown therein, the conventional four-bit parallel test circuit includes: an input/output pad 100 for receiving four-bit identical data in a test mode and for outputting resultant data after the test; an input circuit unit 110 for receiving the data from the input/output pad 100 in accordance with a write enable signal; a write driving unit 120 for transmitting the four-bit data from the input circuit unit 110 in accordance with the write enable signal via 4 IO line couples 101T/B, 102T/B, 103T/B, 104T/B, for thus being written in each memory; a memory mat unit 130 provided with 4 memory mats MAT1, MAT2, MAT3, MAT4, each having a memory cell wherein the four-bit data are respectively written and stored and an X, Y address decoder for accessing the memory cell; a main amp unit 140 provided with 4 main amplifiers M/A1, M/A2, M/A3, M/A4 for respectively amplifying a feeble voltage difference between two signals supplied through coupled line T and line B of the IO line couples 101T/B, 102T/B, 103T/B, 104T/B, respectively connected to the main amplifiers M/A1, M/A2, M/A3, M/A4 in accordance with a read enable signal, and outputting the amplified voltage difference as an one-bit logic value; a data reducing unit 150 for reducing four-bit data outputted from the main amplifiers M/A1, M/A2, M/A3, M/A4, respectively, to a one-bit data signal in accordance with the read enable signal; and an output circuit unit 160 for outputting the data from the data reducing unit 150 to the input/output pad 100.

Now, a four-bit parallel test process for DRAM according to the conventional art will be described.

First, when four-bit identical data are inputted through the input/output pad 100 for the test, the input circuit unit 110 and the write driving unit 120 are driven in accordance with the write enable signal, and the four-bit data are supplied to the 4 IO line couples 101T/B, 102T/B, 103T/B, 104T/B, respectively, and written in the memory mats MAT1, MAT2, MAT3, MAT4 of the memory mat unit 130.

Here, since the read enable signal is not enabled, other block units may not be operated.

When the data write operation in the memory mat unit 130 is completed, the read enable signal is enabled and accordingly the main amp unit 140, data reducing unit 150, and output circuit unit 160 are operated.

An one-bit data signal supplied through the coupled line T and the line B connected to each of the memory mats MAT1, MAT2, MAT3, MAT4 of the memory mat unit 130 becomes an input signal of each of the main amplifiers M/A1, M/A2, M/A3, M/A4 of the main amp unit 140.

Here, each coupled lines T and B of the four IO line couples, which are inputted to the main amp unit 140, have a slight voltage difference. Each of the main amplifiers M/A1, M/A2, M/A3, M/A4 of the main amp unit 140 amplifies the voltage difference and determines an output signal MOCi (I=1,2,3,4) as a logic '1' or '0' with respect to each input signal in accordance with a value of the amplified voltage difference.

Next, the data reducing unit 150 compares the four-bit data signals MOCi (I=1, 2, 3, 4) outputted from the main amplifiers M/A1, M/A2, M/A3, M/A4 of the main amp unit 140, and thus outputs '1' when the four-bit data signals are identically '1' or '0' and outputs '0' when at least an one-bit data signal has a different logic value.

The one-bit data signal reduced by the data reducing unit 150 is transmitted to the input/output pad 100 through the output circuit unit 160.

Lastly, when the data transmitted to the input/output pad 100 is '1', it is considered that the write and read operation for the four-bit data are normally carried out, while the data is '0', at least an one-bit data signal is erroneously operated.

According to the conventional parallel test method, since the data signals transmitted from the memory mats to the lines IOi T/B are the signals having the slight voltage difference, each main amplifier should amplify the data signals to compare a data logic of each parallel bit data.

Thus, since each main amplifier takes charge of an one-bit data signal, only an n bit parallel test is possible in DRAM provided with an n number of main amplifiers.

SUMMARY OF THE INVENTION

Accordingly, an object of the present invention is to provide a parallel test circuit for memory device, wherein a main amplifier compares and amplifies two-bit data, capable of testing a 2n number of data with an n number of main amplifiers.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the improved parallel test circuit for memory device includes: a plurality of memory mats, wherein each of memory mats comprises a memory cell for writing two-bit data and an X, Y address decoder for accessing the memory cell; a amplifying unit having a plurality of main amplifiers, wherein each of main amplifiers compares and amplifies a voltage difference between two-bit data of corresponding memory cell, and thereby output one-bit logic value; a data reducing unit for reducing a plurality of logic value from the amplifying unit to one-bit logic value.

It is to be understood that both the foregoing general description and the following detailed description are exemplary and explanatory and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1:
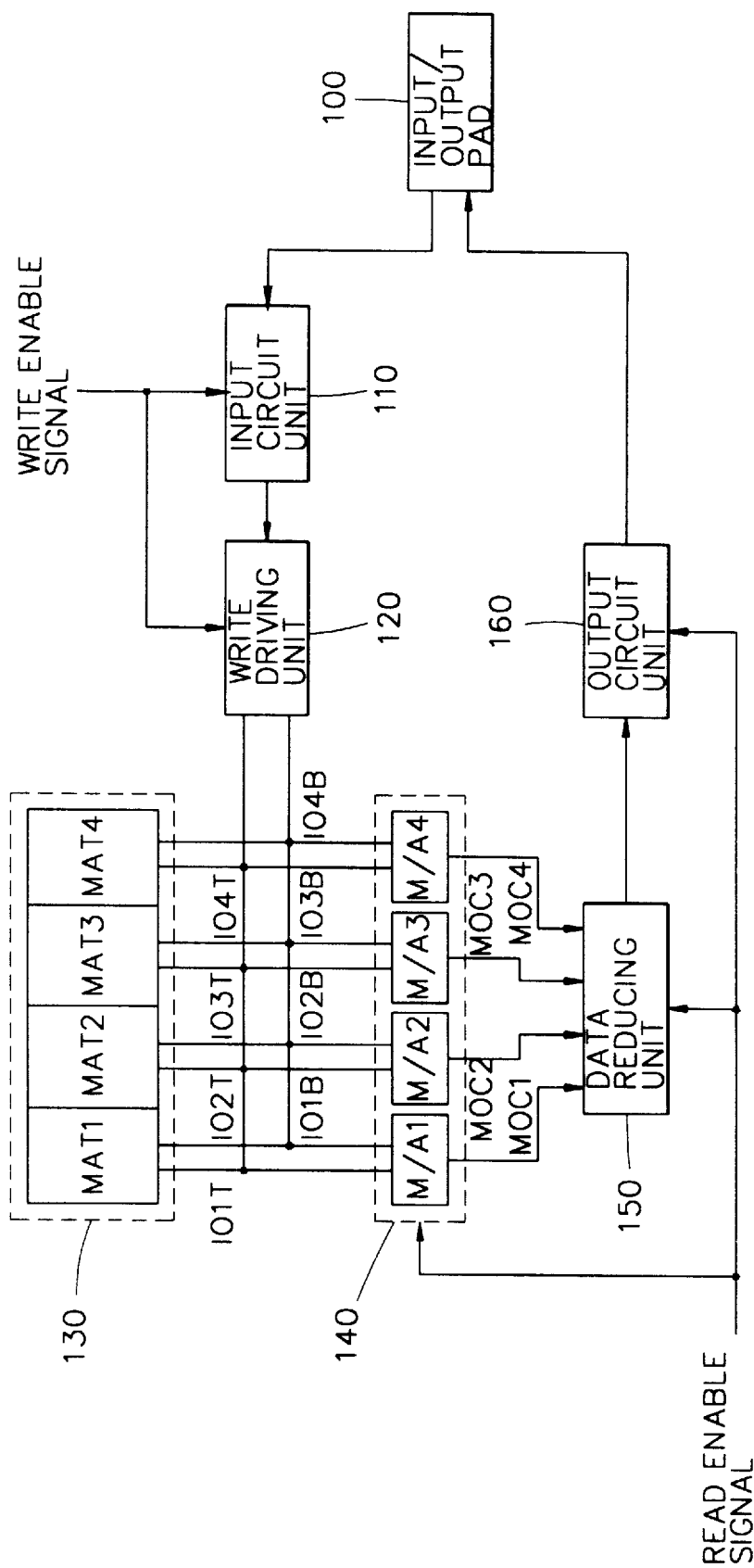
FIG. 1 is a four-bit parallel test circuit diagram for DRAM according to a conventional art.
Figure 2:
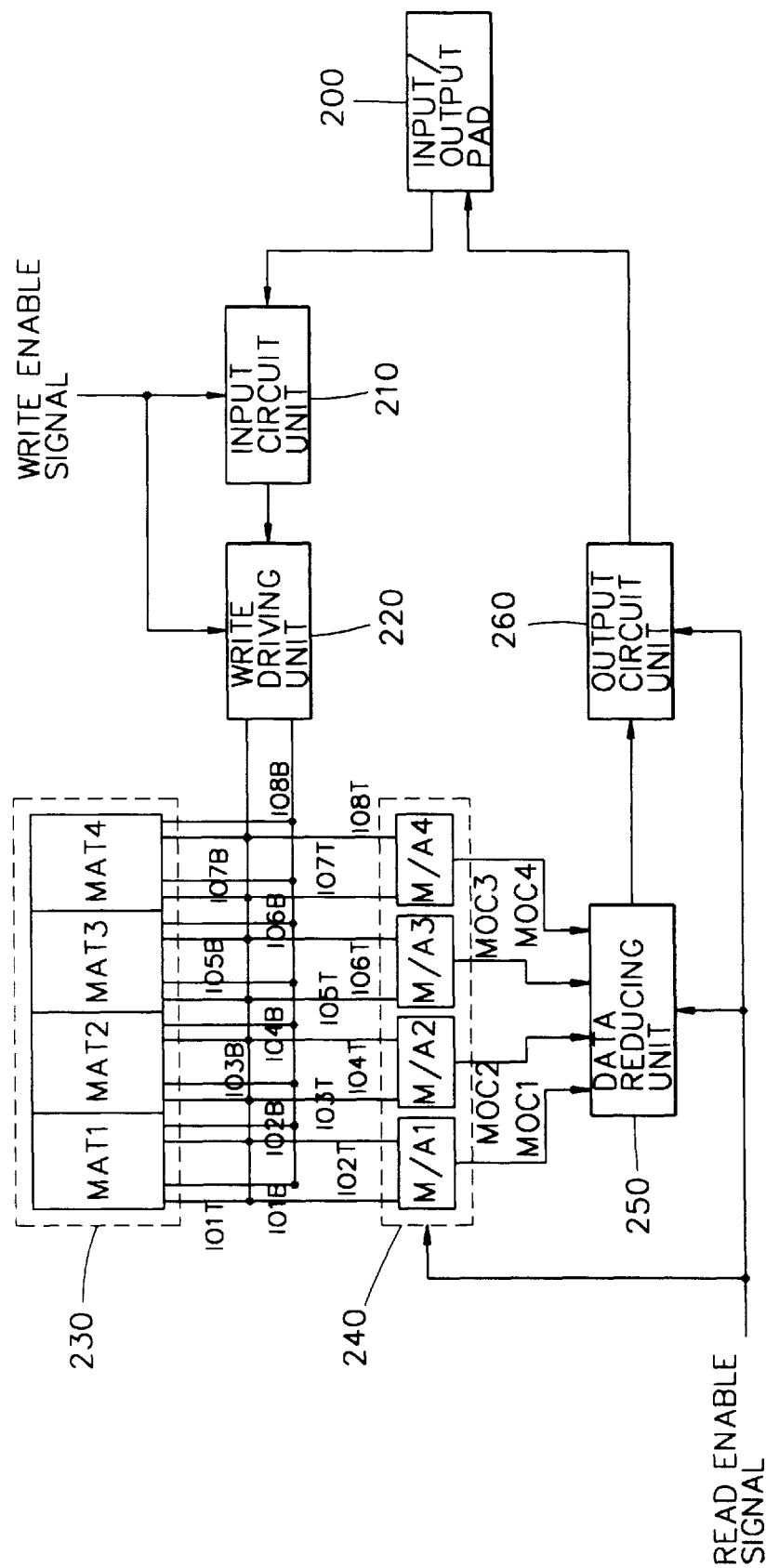
FIG. 2 is an eight-bit parallel test circuit diagram for DRAM according to an embodiment of the present invention.

FIG. 2 illustrates an eight-bit parallel test circuit diagram for DRAM which applies 4 main amplifiers according to an embodiment of the present invention.

As shown therein, the eight-bit parallel test circuit in accordance with the invention includes: an input/output pad 200 for receiving eight-bit identical data in a test mode and for outputting resultant data after the test; an input circuit unit 210 for receiving the data from the input/output pad 200 in accordance with a write enable signal; a write drive unit 220 for writing the eight-bit data supplied from the input circuit unit 210 to a memory by transmitting the eight-bit data through 8 IO line couples (IOk T/B, k=1–8), respectively, in accordance with the write enable signal; a memory mat unit 230 provided with four memory mats MAT1, MAT2, MAT3, MAT4, each having a memory cell for writing and storing two-bit data each among the eight-bit data and an X, Y address decoder for accessing the memory cell; a main amp unit 240 provided with 4 main amplifiers M/A1, M/A2, M/A3, M/A4 for respectively comparing and amplifying the two-bit data supplied through the line T (10 kT, k=1–8) of each IO line couple, a pair of IO line couples are respectively connected to each of the main mats MAT1, MAT2, MAT3, MAT4 in accordance with a read enable signal, and outputting a resultant as an one-bit logic value determining whether the two-bit data are identical; a data reducing unit 250 for reducing four-bit data, which are respectively supplied from the main amplifiers M/A1, M/A2, M/A3, M/A4 in accordance with the read enable signal, to an one-bit data signal; and an output circuit unit 260 for supplying the data from the data reducing unit 250 to the input/output pad 200.

Now, the operation of the parallel test circuit in accordance with the invention will be described with reference to the accompanying drawings.

When eight-bit identical data are supplied through the input/output pad 200, the write/enable signal is enabled, and thus the input circuit unit 210 and the write drive unit 220 are driven. Accordingly, the data from the write drive unit 200 are written in the 4 memory mats, respectively, in the memory mat unit 230 by being transmitted to each of 8 IO line couples (IOkT/B, k=1–8). Since a pair of IO line couples are respectively connected to each memory mat, two-bit data are written in each of the memory mats MAT1, MAT2, MAT3, MAT4.

When the data write operation is completed in the memory mat unit 230, the read enable signal is enabled, for thereby operating the main amp unit 240, data reducing unit 250 and output circuit unit 260. A pair of signals, inputted through T lines between the IO line couples of which two line couples are connected to the memory mats MAT1, MAT2, MAT3, MAT4, respectively, in the memory mat unit 230, become input signals of each of the main amplifiers M/A1, M/A2, M/A3, M/A4 of the main amp unit 240.

Each of the main amplifiers M/A1, M/A2, M/A3, M/A4 compares and amplifies the inputted two-bit data and outputs a one-bit logic value determining whether the two-bit data are identical.

Figure 3:
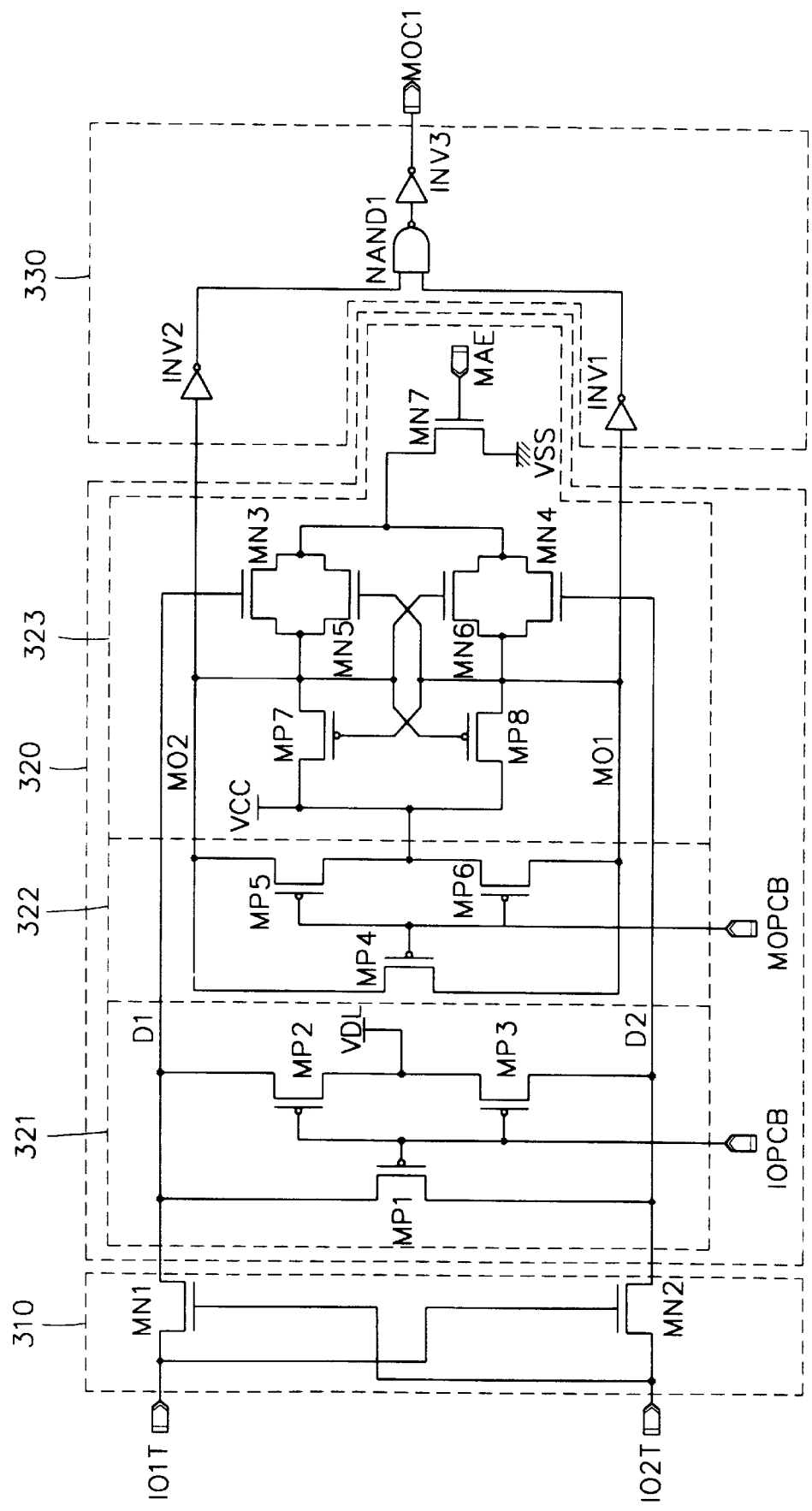
FIG. 3 is a detailed circuit diagram of a main amplifier in FIG. 2.

FIG. 3 is a detailed circuit of the main amplifier M/A1, wherein the main amplifier M/A1 includes: a signal input unit 310 for receiving two-bit data signals through a pair of lines of lines T among a pair or IO line couples connected to each of the memory mats; an amplifying unit 320 for amplifying a voltage difference of the two signals from the signal input unit, wherein the amplifying unit 320 includes: a first precharging unit 321 coupled to the signal input unit 310 for precharging nodes D1, D2 to a predetermined voltage level in accordance with IOPCB signal; a direct sensing unit 323 coupled to the signal input unit 310 and the first precharging unit 321 for sensing and amplifying a voltage difference between two signals from the signal input unit 310 in accordance with MAE signal; a second precharging unit 322 coupled to the direct sensing unit 323 for precharging nodes MO1, MO2 to a predetermined voltage level in accordance with MOPCB signal; and a signal discrimination unit 330 for determining whether the two signals are identical in accordance with an output value of the amplifying unit 320.

The operation of the embodiment will be described in detail.

First, an IOPCB and a MOPCB signals respectively become a logic 'low' in an initial state, and thus nodes D1 and D2 are precharged at a VDL level, a precharged level of IO line couples, and nodes MO1 and MO2 are precharged at a VCC level, a logic 'high' level.

When each node becomes precharged, the IOPCB and MOPCB signals become a high level, for thereby turning off PMOS transistors MP1, MP2, MP3, MP4, MP5, MP6.

When two-bit data written in the first memory mat MAT1 are transmitted to the first main amplifier M/A1 through input signal lines IO1T, IO2T, the data are connected to source nodes of the NMOS transistors MN1, MN2, respectively, and, at the same time, the input signals through the lines IO1T and IO2T drive gate nodes of the NMOS transistors MN2 and MN1, respectively.

A voltage difference between the input signals IO1T, IO2T should be above a threshold voltage of the NMOS transistor MN1 or MN2, in order that the data supplied from the input signal lines IO1T or IO2T are transmitted to the node D1 or D2.

If the input signals IO1T and IO2T are the same level signals, that is the two signals are a high or a low level, the voltage difference above the threshold voltage is not generated. Thus, the NMOS transistors MN1 and MN2 are maintained in an off state, and the nodes D1, D2 are precharged at the VDL level, for thus the nodes MO1, MO2 become a logic 'low' level.

The two signals IO1T, IO2T are inverted to a logic 'high' by a second and a first inverter INV2, INV1, respectively, and a NAND gate NAND 1 outputs a logic 'low' with respect to the two input signals at the high level. A third inverter INV3 inverts the resultant signals to a high level and then a final output MOC1 outputs a logic 'high'.

On the other hand, when the signals IO1T, IO2T are different, for instance when the signal IO1T lower then the signal IO2T is lower than the threshold voltage of the NMOS transistor MN1, the NMOS transistor is on, and low level data of the IO1T are transmitted to the node D1, and the NMOS transistor MN2 maintains an off state, for thus maintaining the node D2 at the VDL level.

Thus, there is generated a voltage difference between the D1 and D2, and a MAE signal becomes a logic 'high', for thus operating a direct sensing amp, constituted of MP7, MP8, MN3, MN4, MN5, MN6, MN7, and outputting each amplified signal to the MO1 and MO2 nodes. Accordingly, the node MO1 becomes a logic 'low' and the node MO2 becomes a logic 'high', and the final output MOC1 becomes a logic 'low'.

While, when the signal IO2T lower then the signal IO1T is lower than the threshold voltage of the NMOS transistor MN2, the node MO1 becomes a logic 'high' and the node MO2 becomes a logic 'low'. However, the final output MOC1 will be also the logic 'low' in accordance with the property of the NAND gate.

The comparing and amplifying operation of the first main amplifier M/A1 is identically carried out in the second, third and fourth amplifiers M/A2, M/A3, M/A4.

Final output values (MOCi, I=1, 2, 3, 4), each outputted from the main amplifiers M/A1, M/A2, M/A3, M/A4 of the main amp unit 240 are inputted to the data reducing unit 250 which compares the four-bit data (MOCi, I=1, 2, 3, 4), and outputs a logic 'high' value when the data have the same logic value and outputs a logic 'low' value when at least one-bit data has a different logic value. The one-bit data signal reduced by the data reducing unit 250 is transmitted through the output circuit unit 260 to the input/output pad 200.

Lastly, when a data signal supplied to the input/output pad 200 is a logic 'high', it is judged that all the eight-bit data has the normal write and read operation and, when a logic 'low', judged that at least one-bit data is erroneously operated.

As described above, the parallel test circuit for Memory device according to the present invention increases test efficiency twice since the circuit may test 2n bit data with a main amplifier of the n number.

It will be apparent to those skilled in the art that various modifications and variations can be made in the parallel test circuit for the memory device of the present invention without departing from the spirit or scope of the invention. Thus, it is intended that the present invention cover the modifications and variations of this invention provided they come within the scope of the appended claims and their equivalents.

What is claimed is:

1. A test circuit for memory device, comprising:
   a memory mat unit having a plurality of memory mats, wherein each of memory mats comprises a memory cell for writing a two-bit data and an X, Y address decoder for accessing the memory cell;
   a main amplifier unit having a plurality of main amplifiers, wherein each of main amplifiers compares and amplifies a voltage difference between the two-bit data of corresponding memory cell, and output an one-bit logic value; and
   a data reducing unit for reducing a plurality of one-bit logic values from the main amplifiers to an one-bit logic value.

2. The test circuit of claim 1, wherein each of the main amplifiers comprises:
   a signal input unit for receiving two input signals from corresponding memory mat;
   an amplifying unit for amplifying a voltage difference between the two input signals; and
   a signal discrimination unit for determining whether the two input signals are identical in accordance with an output value of the amplifying unit.

3. The test circuit of claim 2, wherein the signal input unit comprises:

a first transistor having a first electrode coupled to a first input signal and a control electrode to a second input signal; and
a second transistor having a first electrode coupled to the second input signal and a control electrode coupled to the first input signal.

4. The test circuit of claim 3, wherein the control, first and second electrodes are a gate, a source and a drain, respectively.

5. The test circuit of claim 3, wherein the first and second transistors are NMOS transistors.

6. The test circuit of claim 2, wherein the amplifying unit comprises:
   a first precharging unit coupled to the signal input unit for precharging a second electrode of a first and second transistor of the signal input unit to a first predetermined voltage level in accordance with a first control signal;
   a direct sensing unit coupled to the first precharging unit for sensing and amplifying a voltage difference between two signals from the signal input unit in accordance with a third control signal; and
   a second precharging unit coupled to the direct sensing unit for precharging output nodes of the amplifying unit to a predetermined voltage level in accordance with a second control signal.

7. The amplifying unit of claim 6, wherein the first precharging unit comprises:
   a third transistor coupled to the signal input unit with a control electrode that receives the first control signal;
   a fourth transistor having a control electrode coupled to the control electrode of the third transistor, wherein a first electrode of the fourth transistor is coupled to the first electrode of the third transistor, and the first predetermined voltage is applied to the second electrode of the fourth transistor; and
   a fifth transistor coupled in series with the fourth transistor, wherein a control and first electrodes of the fifth transistor are coupled to the control and second electrodes of the third transistor, respectively.

8. The amplifying unit of claim 6, wherein the second precharging unit comprises:
   a sixth transistor having a control electrode that receives the second control signal;
   a seventh transistor having a control and first electrodes coupled to the control and first electrodes of the sixth transistor, respectively, wherein the second predetermined voltage is applied to second electrode of the seventh transistor; and
   an eighth transistor coupled in series with the seventh transistor, wherein a control and first electrodes of the eighth transistor are coupled to the control and second electrodes of the sixth transistor, respectively.

9. The amplifying unit of claim 6, wherein the direct sensing unit comprises:
   a ninth transistor having a control electrode coupled to the first electrode of the fourth transistor;
   a tenth transistor having a control coupled to the first electrode of the eighth transistor, wherein a first and second electrodes of the tenth transistor are coupled to a first and second electrodes of the ninth transistor, respectively;
   an eleventh transistor having a control electrode coupled to the electrode of the seventh transistor, wherein a first and second electrodes of the eleventh transistor are coupled to first and control electrodes of the tenth transistor, respectively;

a twelfth transistor having a control electrode coupled to the first electrode of the fifth transistor, wherein a first and second electrodes of the twelfth transistor are coupled to the first and second electrodes of the eleventh transistor, respectively;

a thirteenth transistor having a control and a second electrodes coupled to the control and second electrodes of the tenth transistor, respectively, wherein a first electrode of the thirteenth transistor is coupled to the second electrode of the seventh transistor;

a fourteenth transistor having a control, a first and a second electrodes coupled to the control and second electrodes of the eleventh transistor, the first electrode of the thirteenth transistor, respectively; and a fifteenth transistor having a first electrode coupled to the first electrode of the tenth transistor, wherein a control and a second electrodes of the fifteenth transistor receive the third control signal and the ground voltage, respectively.

10. The test circuit of claim 9, wherein the control, first and second electrodes are a gate, a source and a drain, respectively.

11. The test circuit of claim 9, wherein the third, fourth, fifth, sixth, seventh, eighth, thirteenth and fourteenth transistors are PMOS transistors, and ninth, tenth, eleventh and twelfth transistors are NMOS transistors.

12. The test circuit of claim 2, wherein the signal discrimination unit comprises:

a first logic gate coupled to the amplifying unit for logically processing;

a second logic gate coupled to the amplifying unit for logically processing;

a third logic gate for logically processing an output of the first logic gate and the second logic gate; and a fourth logic gate for logically processing an output of the third logic gate.

13. The signal discrimination unit of claim 12, wherein the first, second and fourth logic gates are inverters, and third logic gate is a NAND gate.

14. The signal discrimination unit of claim 2, wherein the signal discrimination unit outputs 'high' only when the two input signals are identical.

* * * * *